US012733505B2

(12) United States Patent
Lim et al.

(10) Patent No.: US 12,733,505 B2
(45) Date of Patent: Sep. 8, 2026

(54) LASER DETECTING CIRCUIT AND SEMICONDUCTOR APPARATUS INCLUDING THE SAME

(71) Applicant: SAMSUNG ELECTRONICS CO., LTD., Suwon-si (KR)

(72) Inventors: Cheolhwan Lim, Suwon-si (KR); Kwangho Kim, Yongin-si (KR); Sangjin Lim, Osan-si (KR); Haejung Choi, Daegu (KR); Donghun Heo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 19/028,276

(22) Filed: Jan. 17, 2025

(65) Prior Publication Data

US 2025/0167139 A1 May 22, 2025

Related U.S. Application Data

(62) Division of application No. 17/860,699, filed on Jul. 8, 2022, now Pat. No. 12,230,588.

(30) Foreign Application Priority Data

Jul. 8, 2021 (KR) ........................ 10-2021-0089936

(51) Int. Cl.
*G01J 1/42* (2006.01)
*G11C 29/12* (2006.01)
(Continued)

(52) U.S. Cl.
CPC ......... *H10W 42/405* (2026.01); *G01J 1/4257* (2013.01); *G11C 29/12* (2013.01); *H03K 19/00315* (2013.01)

(58) Field of Classification Search
CPC .. H03K 17/08; H03K 17/081; H03K 17/0814; H03K 17/082; H03K 17/0822;
(Continued)

(56) References Cited

U.S. PATENT DOCUMENTS 5,084,873 A * 1/1992 Houston ................. G06F 11/00 714/48
5,157,335 A * 10/1992 Houston ............. G11C 11/4125 714/E11.144
(Continued)

FOREIGN PATENT DOCUMENTS

CN 105844153 A 8/2016
CN 107403798 A 11/2017
(Continued)

OTHER PUBLICATIONS

Communication dated Dec. 31, 2025 issued by the Taiwan Intellectual Property Office in Taiwanese Patent Application No. 111125720.

*Primary Examiner* — Jason M Crawford
(74) *Attorney, Agent, or Firm* — Sughrue Mion, PLLC

(57) ABSTRACT

A laser detecting circuit is provided. The laser detecting circuit includes a latch circuit with a first inverter configured to invert a first output signal at a first node to generate a second output signal at a second node, and a second inverter configured to generate the first output signal based on the second output signal. The second inverter includes a plurality of PMOS transistors connected in series between a first source voltage and the first node, and a plurality of NMOS transistors. A gate of each of the plurality of PMOS transistors is connected to the second node, and a drain of each of the plurality of NMOS transistors is connected to the first node. The plurality of NMOS transistors includes dummy NMOS transistors and normal NMOS transistors.

18 Claims, 8 Drawing Sheets

(51) Int. Cl.
*H03K 19/003* (2006.01)
*H10W 42/40* (2026.01)

(58) Field of Classification Search
CPC .......... H03K 19/003; H03K 19/00315; H03K 19/0033; H03K 19/007; H03K 19/0075; H03K 19/00175; G01J 1/42; G01J 1/4257; G01J 1/44; G11C 29/04; G11C 29/12
See application file for complete search history.

(56) References Cited

U.S. PATENT DOCUMENTS

| | | | | |
|---|---|---|---|---|
| 5,361,033 | A * | 11/1994 | Houston | G11C 7/20 714/E11.144 |
| 8,350,574 | B2 | 1/2013 | Nobukata | |
| 8,488,360 | B2 | 7/2013 | Okuda | |
| 8,766,705 | B2 | 7/2014 | Amanuma et al. | |
| 9,052,345 | B2 | 6/2015 | Lisart et al. | |
| 9,306,573 | B2 * | 4/2016 | McCollum | H03K 19/17768 |
| 9,559,066 | B2 | 1/2017 | Hindman et al. | |
| 10,068,860 | B2 | 9/2018 | Kim et al. | |
| 10,147,033 | B2 | 12/2018 | Morin et al. | |
| 12,230,588 | B2 * | 2/2025 | Lim | H10W 42/405 |
| 2016/0225725 | A1 * | 8/2016 | Kim | H10W 42/405 |
| 2017/0357829 | A1 * | 12/2017 | Park | G06F 21/86 |
| 2020/0279817 | A1 | 9/2020 | Missoni et al. | |
| 2020/0303325 | A1 * | 9/2020 | Lewis | G06F 21/75 |
| 2021/0057358 | A1 | 2/2021 | Sarafianos et al. | |
| 2022/0238460 | A1 * | 7/2022 | Lewis | G06F 21/75 |
| 2023/0020463 | A1 * | 1/2023 | Lim | H10W 42/405 |
| 2025/0167139 | A1 * | 5/2025 | Lim | H10W 42/405 |

FOREIGN PATENT DOCUMENTS

| | | | |
|---|---|---|---|
| KR | 10-2017-0141110 | A | 12/2017 |
| TW | 201640825 | A | 11/2016 |

* cited by examiner

FIG. 3

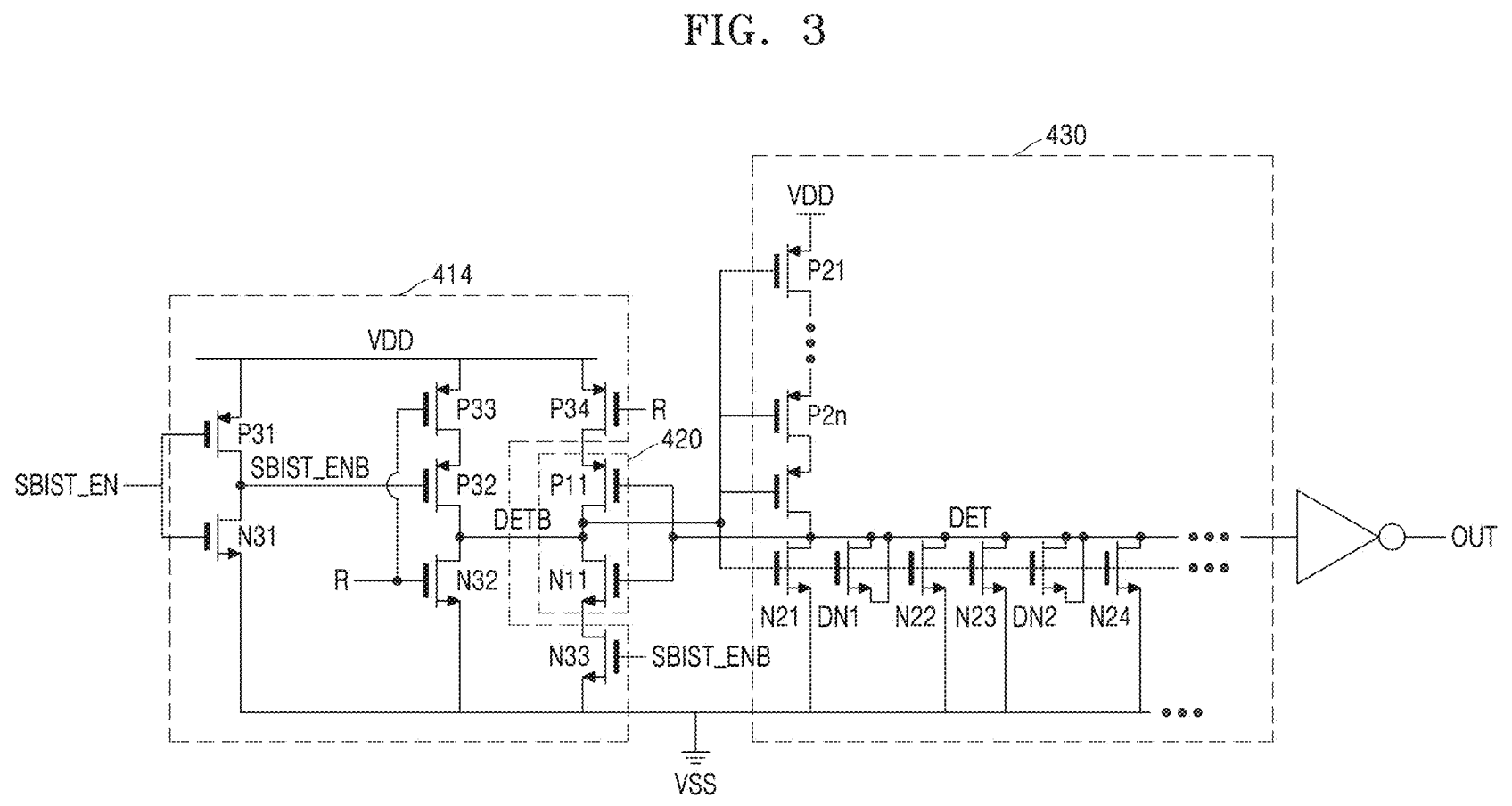

OUT
430
VDD
P21
P2n
DET
N21
DN1
N22
N23
DN2
N24
420
R
SBIST_ENB
VSS
414
P34
P11
N11
N33
DETB
P33
P32
N32
VDD
SBIST_ENB
R
P31
SBIST_ENB
N31
SBIST_EN

430

N-well

VDD

D

VSS D D VSS D D VSS D D VSS D D VSS

N21 DN1 N22 N23 DN2 N24

LASER DETECTING CIRCUIT AND SEMICONDUCTOR APPARATUS INCLUDING THE SAME

CROSS-REFERENCE TO RELATED APPLICATIONS

This application is a Divisional Application of U.S. application Ser. No. 17/860,699, filed on Jul. 8, 2022, which claims priority to Korean Patent Application No. 10-2021-0089936, filed on Jul. 8, 2021, in the Korean Intellectual Property Office, the disclosures of which are incorporated by reference herein in their entireties.

BACKGROUND

Methods, apparatuses and systems consistent with example embodiments relate to a laser detecting circuit, and more particularly, to a laser detecting circuit having high sensitivity and a semiconductor apparatus including the same.

With the development of computer technology, techniques for accessing or corrupting stored information by applying physical attacks to chips have been developed. For example, a chip may be physically attacked by inflicting physical damage on systems themselves or analyzing leaked information with separate equipment and technology.

Physical attacks may include invasive attacks in which a chip package is directly accessed and an IC circuit is observed to analyze an internal structure, semi-invasive attacks in which an error is injected using a laser beam or the like, without physical access, and analyzing a corresponding malfunction, and non-invasive attacks of in which data is acquired through a sub-channel and analyzed.

In order to increase a security level required for chips in preparation for physical attacks and to satisfy the refinement of processes and miniaturization of packages, technology for improving the sensitivity of laser detection while reducing a size of circuits is required.

SUMMARY

One or more example embodiments provide a laser detecting circuit implemented to have a small size, while supporting high sensitivity, and a semiconductor apparatus including the same.

According to an aspect of an example embodiment, there is provided a laser detection circuit including: a latch circuit that includes a first inverter configured to invert a first output signal at a first node to generate a second output signal at a second node, and a second inverter configured to generate the first output signal based on the second output signal. The second inverter includes a plurality of PMOS transistors connected in series between a first source voltage and the first node, and a plurality of NMOS transistors, a gate of each of the plurality of PMOS transistors is connected to the second node, a drain of each of the plurality of NMOS transistors is connected to the first node, and the plurality of NMOS transistors includes dummy NMOS transistors and normal NMOS transistors.

According to an aspect of an example embodiment, there is provided a system-on-chip including: a security processor including a laser detecting circuit; and a non-volatile memory including the laser detecting circuit. The laser detecting circuit includes a first inverter configured to invert a first output signal at a first node to generate a second output signal at a second node, and a second inverter configured to generate the first output signal based on the second output signal, the second inverter includes a plurality of PMOS transistors connected in series between a first source voltage and the first node, and a plurality of NMOS transistors, a gate of each of the plurality of PMOS transistors is connected to the second node, and a drain of each of the plurality of NMOS transistors is connected to the first node, and the plurality of NMOS transistors includes dummy NMOS transistors and normal NMOS transistors.

According to an aspect of an example embodiment, there is provided a laser detecting circuit including: a latch circuit including a first inverter configured to invert a first output signal at a first node to generate a second output signal at a second node, and a second inverter configured to generate the first output signal based on the second output signal. The second inverter includes a plurality of NMOS transistors connected in series between a ground and the first node, and a plurality of PMOS transistors, the plurality of PMOS transistors includes normal PMOS transistors connected in parallel between a first source voltage and the first node, and dummy PMOS transistors, and a source and a drain of each of the dummy PMOS transistors are electrically connected to the first node.

BRIEF DESCRIPTION OF THE DRAWINGS

The above and other aspects, features, and advantages will be more clearly understood from the following detailed description taken in conjunction with the accompanying drawings in which:

FIG. 3 is a transistor level circuit diagram of a laser detecting circuit according to example embodiments;

DETAILED DESCRIPTION

Hereinafter, example embodiments are described in detail with reference to the accompanying drawings.

Figure 1:
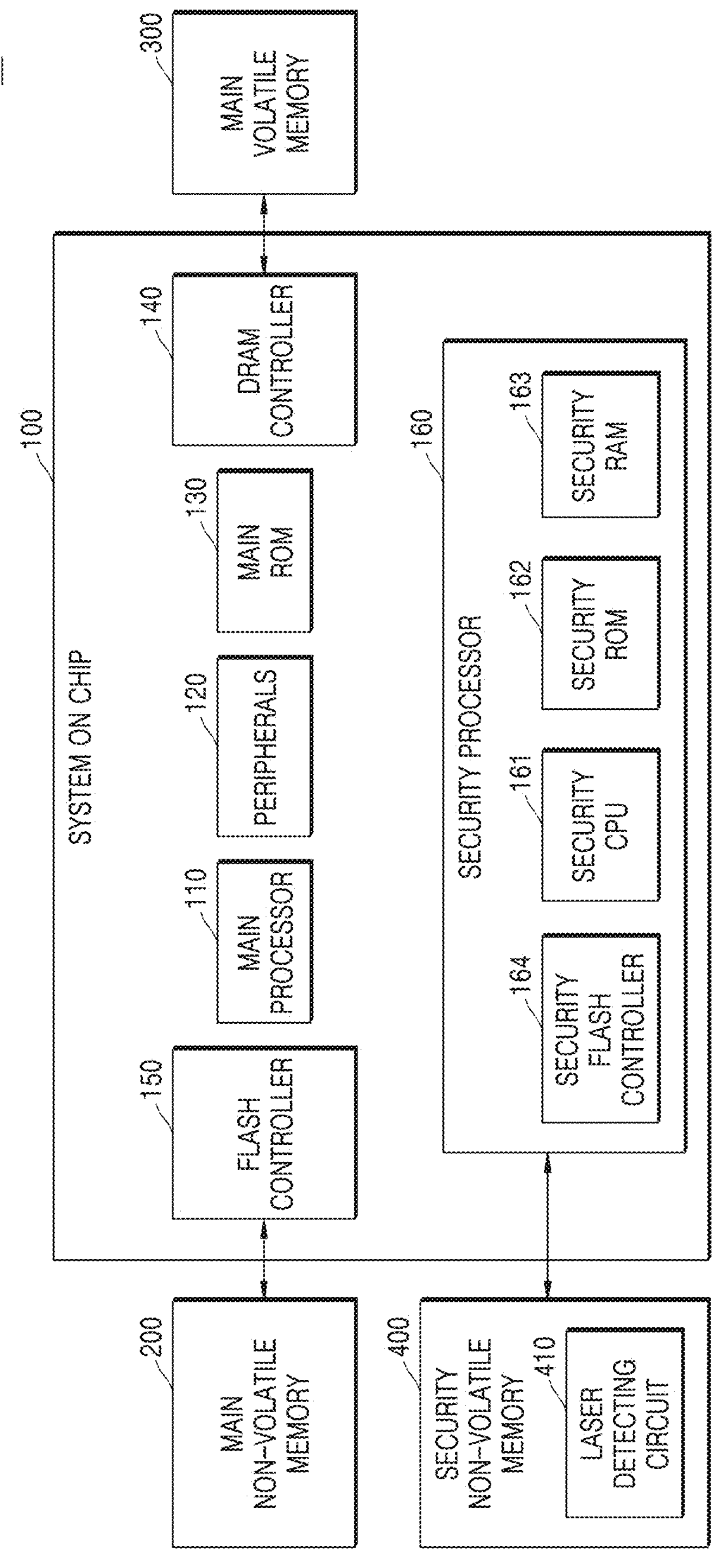
FIG. 1 is a block diagram of an electronic device according to example embodiments.

FIG. 1 is a block diagram of an electronic device 10 according to example embodiments.

Referring to FIG. 1, the electronic device 10 may include a system on chip (SoC) 100, a main non-volatile memory (NVM) 200, a main volatile memory 300, and a security NVM 400.

According to various example embodiments, the SoC 100 includes a main processor 110, peripherals 120, main read only memory (ROM) 130, a DRAM controller 140, a flash controller 150 and a security processor 160.

The main processor 110 may process overall tasks of the SoC 100. For example, in response to power-ON of the electronic device 10, the main processor 110 may load a boot loader into the main volatile memory 300 to perform booting and control an operation of a host application. The main ROM 130 may store various types of control information required for execution of the host application or an operation of the SoC 100. The DRAM controller 140 may manage the main volatile memory 300. For example, the DRAM controller 140 may receive firmware image data from the main NVM 200 and load the received image data into the main volatile memory 300. The peripherals 120 may include devices for input/output of the electronic device 10. For example, the peripherals 120 may include a display controller for controlling a display that provides visual information to a user. The flash controller 150 may write data to or read data from the main NVM 200.

The security processor 160 may include a security CPU 161, security ROM 162, security RAM 163, and a security flash controller 164. The security CPU 161 may control overall operation of the security processor 160 using the security RAM 163 and the security ROM 162. For example, the security CPU 161 may verify a digital signature, encrypt data to be written to the security NVM or decrypt data read from the security NVM 400.

The security flash controller 164 may read or write data from or to the security NVM 400. For example, the security flash controller 164 may write a user ID (identification), password (PW), and user's biometric data (e.g., fingerprint information, iris information, facial recognition information, voice information, vein information) to the security NVM 400.

According to various example embodiments, the security NVM 400 may refer to a non-volatile memory directly connected to the security processor 160 inside the SoC 100. Because the security NVM 400 only communicates with the security processor 160 inside the SoC 100, the security NVM 400 may store data processed by the security processor 160 and requiring security.

The main NVM 200 may refer to a non-volatile memory that the main processor 110 and the security processor 160 may access. For example, the main processor 110 may access the main NVM 200 to drive the boot loader. As another example, the security processor 160 may access the main volatile memory 300 to load data related to firmware updating or may directly access the main NVM 200 to load data related to firmware updating.

According to an example embodiment, the main NVM 200 and the security NVM 400 may be configured as non-volatile memories in which stored data is not destroyed when power supply is cut off. For example, the main NVM 200 and the security NVM 400 may include NAND flash memory, vertical NAND flash memory, NOR flash memory, resistive random access memory (RRAM), phase-change memory, magnetoresistive random access memory, and the like.

The main volatile memory 300 may be a memory accessible by a host application. According to an example embodiment, the main volatile memory 300 may be configured as a memory in which stored data is destroyed when power supply is cut off. For example, the main volatile memory 300 may include static RAM (SRAM), dynamic random access memory (DRAM), and magnetoresistive RAM.

According to an example embodiment, the security NVM 400 may further include a laser detecting circuit 410. The laser detecting circuit 410 may correspond to a circuit for detecting a physical attack using a laser light source. When the laser detecting circuit 410 detects a laser light source, which may be used for a physical attack, the laser detecting circuit 410 may transmit a control signal indicating laser detection to the security processor 160. In response to the laser detection, the security processor 160 may instruct various defense techniques including erasing data stored in the security NVM 400, initializing (zeroing, wiping) data stored in the security NVM 400, or deactivating the electronic device 10. Hereinafter, details of the laser detecting circuit 410 are described with reference to FIG. 2.

The laser detecting circuit 410 has been described as being implemented in the security NVM 400, but example embodiments are not limited thereto. According to example embodiments, the laser detecting circuit 410 may be included in the security processor 160 to detect a laser attack made to the security processor 160. In this regard, when a laser light source is detected by the laser detecting circuit 410, the laser detecting circuit 410 may generate a control signal indicating that a laser attack is detected, for the security processor.

Figure 2:
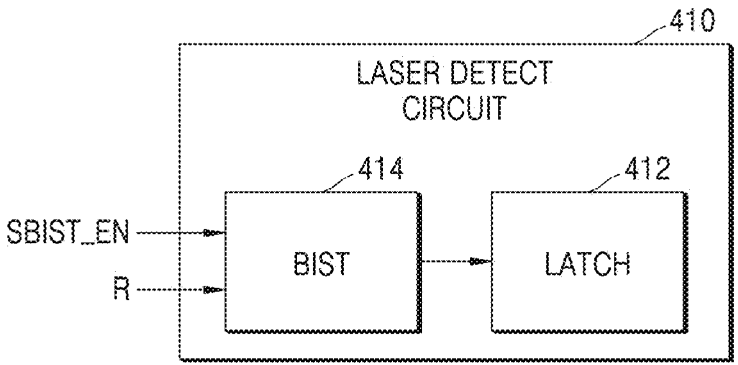
FIG. 2 is a block diagram of a laser detecting circuit according to example embodiments.

FIG. 2 is a block diagram of the laser detecting circuit 410 according to example embodiments.

Referring to FIG. 2, the laser detecting circuit 410 may include a built-in-self-test (BIST) (or a BIST circuit) 414 and a latch (or a latch circuit) 412.

According to various example embodiments, the BIST 414 may correspond to a circuit for testing detection of a laser. For example, the BIST 414 may transmit the same signal that is generated when a laser is applied to the latch 412. Because it may not be feasible to actually apply a laser to the electronic device 10 in order to determine whether the laser detecting circuit 410 normally operates in response to a laser attack, the BIST 414 may be essential.

According to various example embodiments, the latch 412 may detect a laser by inverting an output signal in response to a laser light source. According to an example embodiment, the latch 412 may include a first inverter and a second inverter. An output signal from the first inverter may correspond to an input signal of the second inverter, and an output signal from the second inverter may correspond to an input signal of the first inverter. A laser incident on the latch 412 may cause the current to leak in the second inverter, and thereby cause the output signal of the second inverter to invert.

Because the latch 412 operates based on positive feedback between the first inverter and the second inverter, the laser detection sensitivity may be improved compared to that when only one inverter (the first inverter or the second inverter) is used.

FIG. 3 is a transistor level circuit diagram of the laser detecting circuit 410 according to example embodiments.

Referring to FIG. 3, the laser detecting circuit 410 may include a first inverter 420, a second inverter 430, and the BIST 414.

According to various example embodiments, the first inverter 420 and the second inverter 430 may detect a laser by inverting an output signal in response to a laser light source. For example, the laser light may cause a current to leak through the NMOS transistors of the second inverter 430. The output signal from the first inverter 420 may correspond to an input signal of the second inverter 430. For example, the output signal from the first inverter 420 may correspond to an inverted DET signal DETB. The inverted DET signal DETB may be an input signal of the second inverter 430 and may be applied to gates of a plurality of PMOS transistors and a plurality of NMOS transistors.

According to an example embodiment, an output signal from the second inverter 430 may correspond to an input signal of the first inverter 420. An output signal OUT from the second inverter 430 may correspond to an output signal DET. The output signal DET from the second inverter 430 may be applied to gates of each of PMOS transistors and NMOS transistors of the first inverter 420. The output signal DET from the second inverter 430 may be inverted and output as a laser detection signal OUT. For example, the laser detection signal OUT may be transmitted to the security processor 160 of FIG. 1.

The second inverter 430 may include the NMOS transistors and the PMOS transistors. According to an example embodiment, the PMOS transistors of the second inverter 430 may form a stack structure. For example, assuming that the PMOS transistors correspond to first to third PMOS transistors, a drain terminal of the second PMOS transistor may be connected to a source terminal of the third PMOS transistor, and a source terminal of the second PMOS transistor may be connected to a drain terminal of the first PMOS transistor. By connecting the PMOS transistors according to a series stack structure, the same effect may be obtained as increasing a length of an active region of one PMOS transistor. That is, by stacking the PMOS transistors, a drain-source voltage of the PMOS transistors may be sensed with a smaller current, and thus the sensitivity of laser detection may be increased.

According to an example embodiment, the NMOS transistors may share a drain terminal. The NMOS transistors may be connected to an input node of the first inverter 420. Some of the NMOS transistors may be dummy transistors. In the dummy transistors, source terminals may be electrically connected to drain terminals. For example, the source terminals of the dummy transistors may be connected to the input node of the first inverter 420. The remaining NMOS transistors that are not dummy transistors may be normal NMOS transistors.

A first source voltage VDD may be a positive (+) voltage, and a second source voltage VSS may be a ground voltage GND or a voltage of zero or lower. The second source voltage VSS may be connected to a source terminal of the normal NMOS transistors other than the dummy transistors. The first source voltage VDD may be connected to a source terminal of a PMOS transistor positioned at a starting point of the stack structure among the PMOS transistors.

According to various example embodiments, the BIST 414 may receive a test signal SBIST_EN through gate terminals of the NMOS transistor N31 and the PMOS transistor P31. The NMOS transistor N31 and the PMOS transistor P31 may constitute an inverter. A test signal SBIST_ENB inverted through the NMOS transistor N31 and the PMOS transistor P31 may be input to gate terminals of the PMOS transistor P32 and the NMOS transistor N33. The BIST 414 may receive a reset signal R through gate terminals of an NMOS transistor N32 and PMOS transistors P33 and P34.

According to various example embodiments, a relationship between the reset signal R, the test signal SBIST_EN, and the output signal OUT input to the BIST 414 may be summarized in the table below.

TABLE 1

| Input | | Output |
|---|---|---|
| R | SBIST_EN | OUT |
| 0 | 0 | Previous value |
| 0 | 1 | 1 |
| 1 | 0 | 0 |
| 1 | 1 | 0 |

Referring to Table 1, when both the reset signal R and the test signal SBIST_EN are logic low, the output signal OUT may maintain a previous value. The inverted test signal SBIST_ENB may be applied to the gate terminal of the BIST NMOS transistor N33 connected to the source terminal of the NMOS transistor N11 of the first inverter 420. Because the test signal SBIST_EN is logic low, the inverted test signal SBIST_EN of logic high may turn on the BIST NMOS transistor N33. The reset signal R may be applied to a gate terminal of the BIST PMOS transistor P34 connected to the source terminal of the PMOS transistor P11 of the first inverter 420. Because the reset signal R is logic low, the BIST PMOS transistor P34 may be turned on. That is, when the reset signal R and the test signal SBIST_EN are logic low, the BIST 414 may not appear to the first inverter 420 and a previous value may be maintained. When the reset signal R is logic high, the output signal OUT may be initialized to 0 regardless of the logic value of the test signal SBIST_EN.

Figures 4, 5:
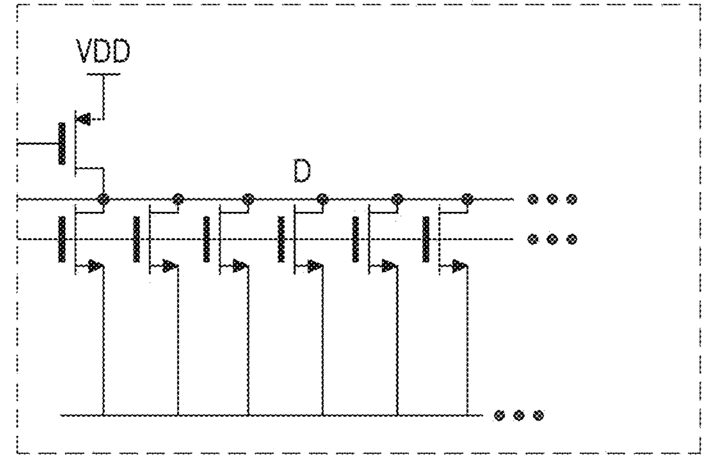
FIG. 4 illustrates an example of a layout according to example embodiments.
FIG. 5 is a transistor level circuit of a laser detecting circuit according to a comparative example.

FIG. 4 illustrates an example of a layout according to example embodiments.

Referring to FIG. 4, drain regions D of the NMOS transistors are shown. Referring to FIG. 3, dummy transistors may be inserted between first to fourth NMOS transistors N21 to N24 connected in parallel. For example, a dummy transistor DN1 may be inserted between the first NMOS transistor N21 and the second NMOS transistor N22. A source terminal and a drain terminal of the dummy transistor DN1 may be connected to each other. Accordingly, it can be seen that one more drain region, which is a region for receiving a laser, is added by inserting the dummy transistor DN1 between the parallel NMOS transistors.

According to various example embodiments, the number of PMOS transistors may be equal to the number of NMOS transistors constituting the second inverter 430. By positioning the same number of PMOS transistors and the same number of NMOS transistors, the PMOS transistors may be aligned to respectively match the NMOS transistors on the layout. Layout optimization may be achieved by matching and aligning PMOS transistors and NMOS transistors.

Figure 6:
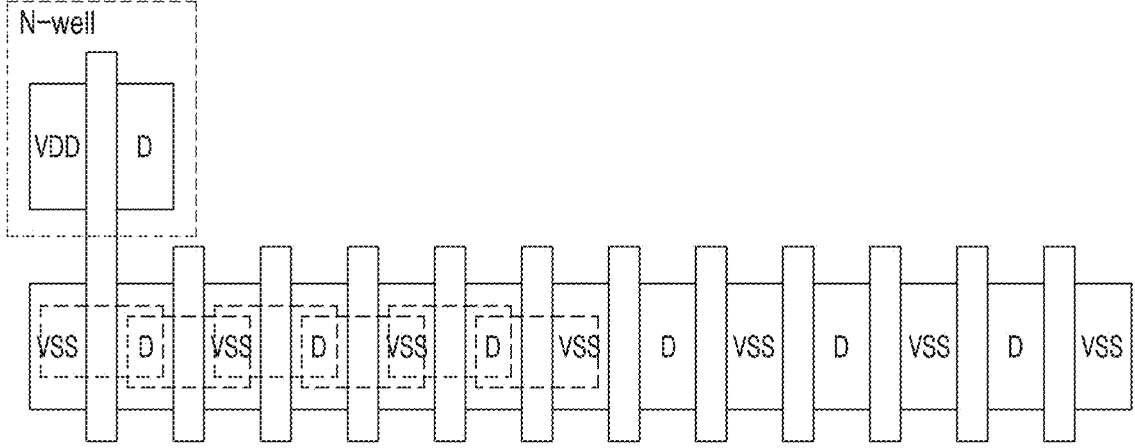
FIG. 6 illustrates a layout according to a comparative example.

FIG. 5 is a transistor level circuit of a laser detecting circuit 410 according to a comparative example, and FIG. 6 illustrates a layout according to the comparative example.

Referring to FIG. 5, an inverter according to the comparative example may include a plurality of NMOS transistors and one PMOS transistor. Because the inverter of FIG. 5 includes only one PMOS transistor, a level of a current required for the PMOS transistors connected in the series stack structure in FIG. 3 to sense a source-drain voltage is greater than that of the inverter according to example embodiments. That is, the laser detection sensitivity of the laser detecting circuit 410 according to the comparative example of FIG. 5 may be further deteriorated.

Referring to the layouts of FIGS. 4 and 6 together, the inverter of FIG. 5 may include a plurality of NMOS transistors connected in parallel. That is, the inverter of FIG. 5 does not include dummy NMOS transistors inserted between the NMOS transistors. A size of a drain region generated by the dummy NMOS transistors may be larger than that of a drain region generated by a NMOS transistor connected to the second source voltage VSS. That is, when the NMOS transistors are connected in parallel without inserting a dummy NMOS transistor, a light-receiving area of a laser light sensor may be reduced, and thus laser detection sensitivity may be deteriorated.

Referring to the layouts of FIGS. 4 and 6 together with FIG. 5, in the inverter of FIG. 5, the number of PMOS transistors may be different from the number of NMOS transistors in the comparative example. That is, in the comparative example there are multiple NMOS transistors connected in parallel, whereas there is only one PMOS transistor. Because the numbers thereof do not match each other, the layout optimization mentioned above may be difficult. In this case, if the inverter includes a plurality of PMOS transistors, an unnecessary additional process should be performed, and accordingly, a size occupied by the inverter may also increase. Additionally, because the NMOS transistor is connected to the second source voltage VSS, the size of the second inverter 430 may be further reduced by inserting a dummy transistor considering a patterning region for the electrical connection.

Referring to the layout of FIG. 6, because the inverter includes only the NMOS transistors connected in parallel and does not include a dummy transistor, the size of the layout of FIG. 6 may be larger than the size of the layout of FIG. 4.

Figure 7:
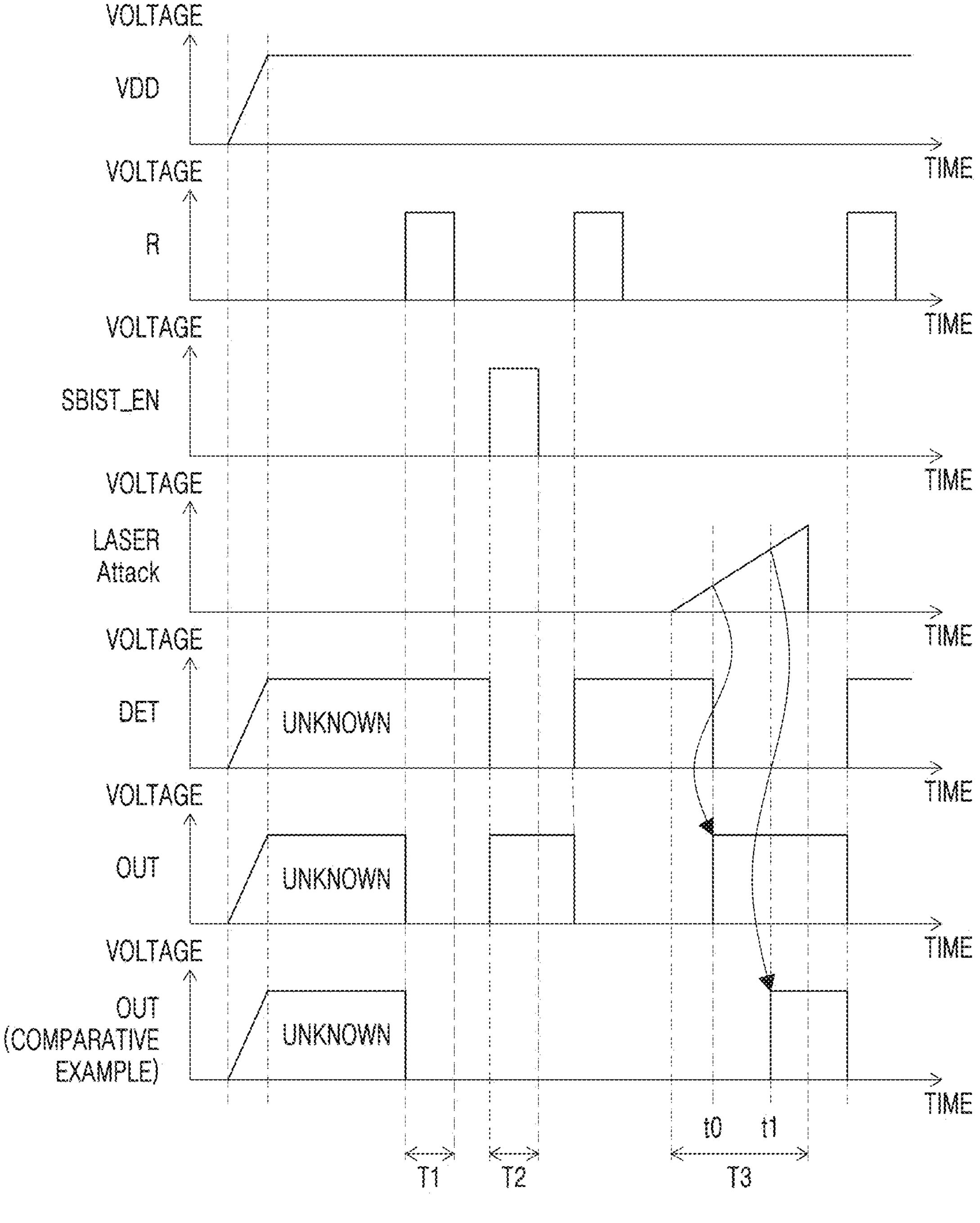
FIG. 7 is a timing diagram illustrating an operation of a laser detecting circuit according to example embodiments.

FIG. 7 is a timing diagram illustrating an operation of the laser detecting circuit 410 according to example embodiments.

Referring to FIG. 7, a reset signal R may be activated in a first period T1. In the first period T1, the test signal SBIST_EN may be maintained logic low. The laser detecting circuit 410 may maintain the output signal OUT logic low in response to the reset signal R at logic high. A value of the output signal OUT before the first period T1 is unknown, and in the first period T1, the output signal OUT may be changed to "0" or maintained in response to the reset signal R at logic high and the test signal SBIST_EN at logic low.

In a second period T2, the test signal SBIST_EN may be activated. In the second period T2, the reset signal R may be maintained logic low. The laser detecting circuit 410 may also transition the output signal OUT from "0" to "1" in response to the test signal SBIST_EN at logic high. That is, it can be seen that, as the test signal SBIST_EN is activated, the same output signal OUT as that in which a laser is detected is generated. The first period T1 and the second period T2 may be referred to as a BIST test period.

In a third period T3, a laser light source may be input. The intensity of the laser light source may increase proportionally over time. In the case of a high-sensitivity laser detecting circuit according to example embodiments, when the intensity of the laser light source reaches a first level (a point in time t0), the output signal OUT may transition from "0" to "1". In the case of a low-sensitivity laser detecting circuit, when the intensity of the laser light source reaches a second level (a point in time t1 after t0), the output signal OUT may transition from "0" to "1". The second level may be greater than the first level. That is, the laser detecting circuit 410 of FIG. 3 may notify the security processor 160 that the laser detecting circuit 410 is receiving a laser attack at the point in time to based on the increased laser input. The laser detecting circuit according to the comparative example of FIG. 5 may generate a signal indicating that the laser detecting circuit is receiving a laser attack at the point in time t1 (after the point in time t0) based on the higher level laser input.

Figure 8:
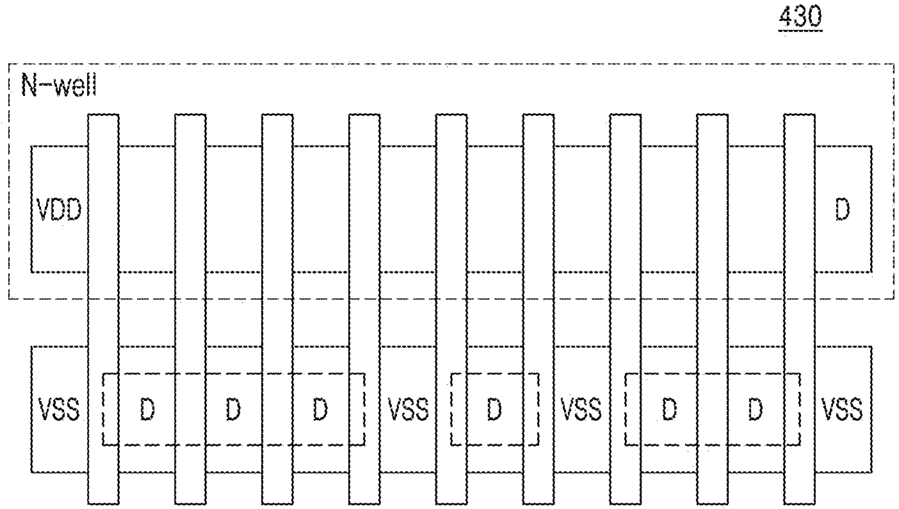
FIG. 8 illustrates another example of a layout according to example embodiments.
Figure 9:
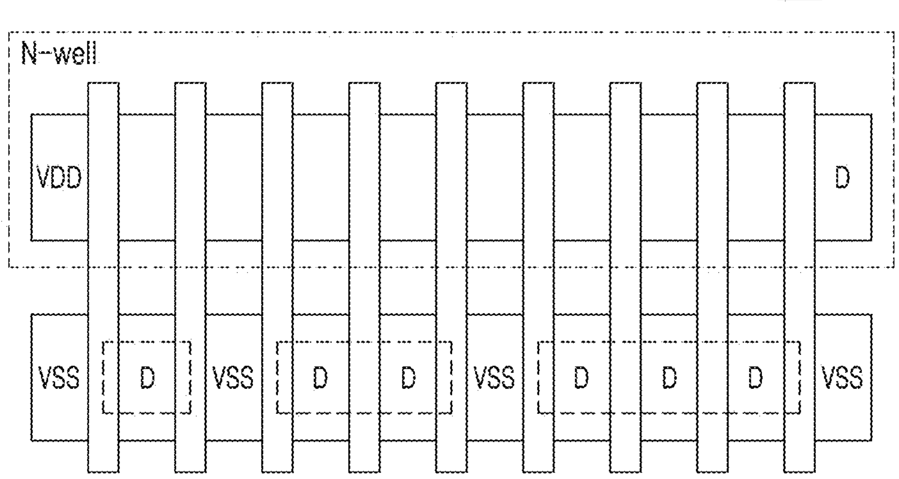
FIG. 9 illustrates another example of a layout according to example embodiments.
Figure 10:
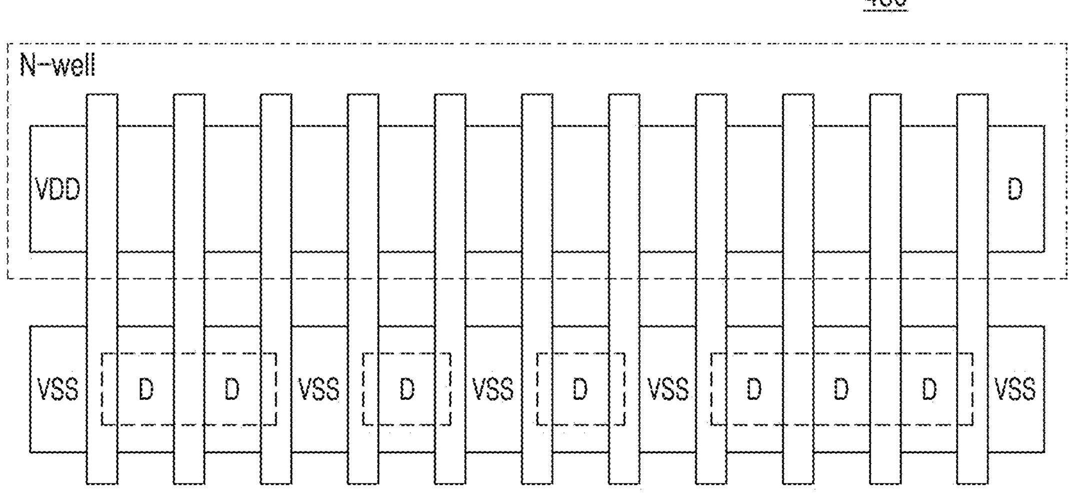
FIG. 10 illustrates another example of a layout according to example embodiments.

FIGS. 8 to 10 illustrate other examples of layouts according to example embodiments.

Referring to FIG. 8, a layout of the second inverter 430 may include drain regions based on a first pattern. For example, the first pattern may be a pattern in which drain regions of (3, 1, 2) are repeated. In order to include the drain regions of the first pattern, the dummy transistor of the second inverter 430 may be positioned between a plurality of NMOS transistors connected in parallel according to a (2, 0, 1) pattern. That is, when first to fourth NMOS transistors are sequentially connected in parallel, two dummy transistors may be positioned between the first NMOS transistor and the second NMOS transistor, zero (0) dummy transistors may be positioned between the second NMOS transistor and the third NMOS transistor, and one dummy transistor may be positioned between the third NMOS transistor and the fourth NMOS transistor.

Referring to FIG. 9, a layout of the second inverter 430 may include drain regions based on a second pattern. For example, the second pattern may be a pattern in which drain regions of (1, 2, 3) are repeated. In order to include the drain regions of the second pattern, the dummy transistor of the second inverter 430 may be positioned between a plurality of NMOS transistors connected in parallel according to a (0, 1, 2) pattern. That is, when first to fourth NMOS transistors are sequentially connected in parallel, zero (0) dummy transistors may be positioned between the first NMOS transistor and the second NMOS transistor, one dummy transistor may be positioned between the second NMOS transistor and the third NMOS transistor, and two dummy transistors may be positioned between the third NMOS transistor and the fourth NMOS transistor.

Referring to FIG. 10, a layout of the second inverter 430 may include drain regions based on a third pattern. For example, the third pattern may be a pattern in which drain regions of (2, 1, 1, 3) are repeated. In order to include the drain regions of the third pattern, the dummy transistor of the second inverter 430 may be positioned between a plurality of NMOS transistors connected in parallel according to a (1, 0, 0, 2) pattern. That is, when first to fifth NMOS transistors are sequentially connected in parallel, one dummy transistor may be positioned between the first NMOS transistor and the second NMOS transistor, zero (0) dummy transistors may be positioned between the second NMOS transistor and the third NMOS transistor and between the third NMOS transistor and the fourth NMOS transistor, and two dummy transistors may be positioned between the fourth NMOS transistor and the fifth NMOS transistor.

Although it is illustrated that the dummy transistors are positioned according to certain patterns above, example embodiments are not limited thereto. A combination of the number of drain regions according to the number of patterns of the dummy transistors and an arrangement relationship thereof may vary.

Figure 11:
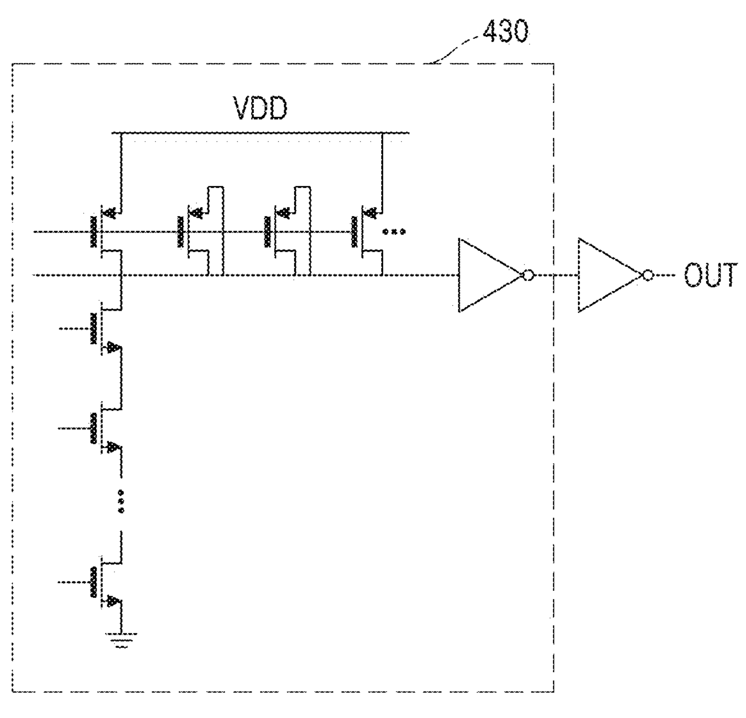
FIG. 11 is a transistor level circuit diagram of a laser detecting circuit according to example embodiments.

FIG. 11 is a transistor level circuit diagram of a second inverter 430 of the laser detecting circuit 410 according to an example embodiment.

Referring to FIG. 11, the second inverter 430 may include a plurality of NMOS transistors and a plurality of PMOS transistors. According to an example embodiment, the NMOS transistors may form a stack structure. For example, it may be assumed that the NMOS transistors correspond to first to third NMOS transistors. A drain terminal of the second NMOS transistor may be connected to a source terminal of the first NMOS transistor, and a source terminal of the second NMOS transistor may be connected to a drain terminal of the third NMOS transistor. By connecting the NMOS transistors according to a series stack structure, the same effect as that of increasing a length of an active region of one NMOS transistor that may be replaced with an equivalent circuit may be obtained. That is, by stacking the NMOS transistors, a drain-source voltage of the NMOS transistors may be significantly sensed even with a smaller current, and thus the sensitivity of laser detection may be increased.

In the second inverter 430 shown in FIG. 11, the PMOS transistors may share a drain terminal. The PMOS transistors may be connected to the input node of the first inverter 420. At least one dummy transistor may be provided between the PMOS transistors. The dummy transistors may correspond to PMOS transistors. In the dummy transistors, a source terminal and a drain terminal may be electrically connected to each other. For example, the source terminals of the dummy transistors may be connected to the input node of the first inverter 420, rather than to the first source voltage VSS.

A smaller leakage current may be sensed by the NMOS transistors connected in series to form a stack structure, and by inserting a dummy transistor between the PMOS transistors connected in parallel, a drain region may be increased and the light-receiving area of a laser may be increased, and thus, the sensitivity of laser detection may be improved as described above with reference to FIG. 3. In the laser detecting circuit according to an example embodiment, the sensitivity of laser detection may be increased by increasing a region for receiving a laser light source using a dummy transistor. In the laser detecting circuit according to an example embodiment, whether laser detection is normally performed may be determined by a built-in-self-test (BIST) even if an actual laser light source is not applied.

While aspects of example embodiments have been particularly shown and described, it will be understood that various changes in form and details may be made therein without departing from the spirit and scope of the following claims.

What is claimed is:

1. A laser detecting circuit comprising:

a latch circuit comprising a first inverter configured to invert a first output signal at a first node to generate a second output signal at a second node, and a second inverter configured to generate the first output signal based on the second output signal, wherein the second inverter comprises a plurality of NMOS transistors connected in series between a first source voltage and the first node, and a plurality of PMOS transistors, a gate of each of the plurality of NMOS transistors is connected to the second node, and a drain of each of the plurality of PMOS transistors is connected to the first node, and the plurality of PMOS transistors comprises dummy PMOS transistors and normal PMOS transistors.

2. The laser detecting circuit of claim 1, wherein, a source of each of the dummy PMOS transistors is electrically connected to the first node.

3. The laser detecting circuit of claim 1, wherein a source of each of the normal PMOS transistors, among the plurality of PMOS transistors, is connected to a ground node.

4. The laser detecting circuit of claim 1, wherein there is an equal number of PMOS transistors and NMOS transistors provided in the second inverter.

5. The laser detecting circuit of claim 1, wherein a source of each of the dummy PMOS transistors is electrically connected to the first node, the normal PMOS transistors are connected in parallel between the first node and a ground node, and the dummy PMOS transistors and the normal PMOS transistors are alternately arranged according to a predefined ratio of normal PMOS transistors to dummy PMOS transistors.

6. The laser detecting circuit of claim 5, wherein the predefined ratio is 2 to 1, and two normal PMOS transistors are arranged between neighboring dummy PMOS transistors according to the predefined ratio.

7. The laser detecting circuit of claim 5, wherein the predefined ratio is 1 to 1, and one dummy PMOS transistor is positioned between neighboring normal PMOS transistors according to the predefined ratio.

8. The laser detecting circuit of claim 1, further comprising:

a self-test circuit electrically connected to the first inverter and configured to control a logic level of the second output signal based on a reset signal and a test enable signal.

9. The laser detecting circuit of claim 8, wherein the self-test circuit is configured to control the second output signal to a logic low based on the reset signal being a logic high, and control the second output signal to the logic high based on the reset signal being the logic high and the test enable signal being the logic high.

10. A system-on-chip comprising:

a security processor comprising a laser detecting circuit; and a non-volatile memory comprising the laser detecting circuit, wherein the laser detecting circuit comprises a first inverter configured to invert a first output signal at a first node to generate a second output signal at a second node, and a second inverter configured to generate the first output signal based on the second output signal, the second inverter comprises a plurality of NMOS transistors connected in series between a first source voltage and the first node, and a plurality of PMOS transistors, a gate of each of the plurality of NMOS transistors is connected to the second node, and a drain of each of the plurality of PMOS transistors is connected to the first node, and the plurality of PMOS transistors comprises dummy PMOS transistors and normal PMOS transistors.

11. The system-on-chip of claim 10, wherein, a source of each of the dummy PMOS transistors is electrically connected to the first node.

12. The system-on-chip of claim 10, wherein a source of each of the normal PMOS transistors, among the plurality of PMOS transistors, is connected to a ground node.

13. The system-on-chip of claim 10, wherein there is an equal number of PMOS transistors and NMOS transistors provided in the second inverter.

14. The system-on-chip of claim 10, wherein a source of each of the dummy PMOS transistors is electrically connected to the first node, the plurality of PMOS transistors are connected in parallel between the first node and a ground node, and the dummy PMOS transistors and the normal PMOS transistors are alternately arranged according to a predefined ratio of normal PMOS transistors to dummy PMOS transistors.

15. The system-on-chip of claim 14, wherein the predefined ratio is 2 to 1, and two normal PMOS transistors are arranged between neighboring dummy PMOS transistors according to the predefined ratio.

16. The system-on-chip of claim 14, wherein the predefined ratio is 1 to 1, and one dummy PMOS transistor is positioned between neighboring normal PMOS transistors according to the predefined ratio.

17. The system-on-chip of claim 10, wherein the laser detecting circuit further comprises a self-test circuit electrically connected to the first inverter and configured to control a logic level of the second output signal based on a reset signal and a test enable signal.

18. The system-on-chip of claim 17, wherein the self-test circuit is configured to control the second output signal to a logic low based on the reset signal being a logic high, and control the second output signal to the logic high based on the reset signal being the logic high and the test enable signal being the logic high.

* * * * *